(12) United States Patent
Simonsson et al.

(10) Patent No.: US 7,442,046 B2
(45) Date of Patent: Oct. 28, 2008

(54) FLEXIBLE CIRCUIT CONNECTORS

(75) Inventors: Olof Simon Simonsson, Dalby (SE);
Omid Kazemifar, Staffanstorp (SE);
Mikael Pär-Oskar Häll, Malmö (SE);
Maiko Anneli Karlsson, Malmö (SE);
Håkan Klas Petersson, Lund (SE)

(73) Assignee: Sony Ericsson Mobile Communications AB, Lund (SE)

( * ) Notice: Subject to any disclaimer, the term of this patent is extended or adjusted under 35 U.S.C. 154(b) by 0 days.

(21) Appl. No.: 11/433,363

(22) Filed: May 15, 2006

(65) Prior Publication Data

US 2007/0264845 A1    Nov. 15, 2007

(51) Int. Cl.
*H01R 12/00* (2006.01)
(52) U.S. Cl. ....................................................... 439/67
(58) Field of Classification Search ............... 439/67, 439/77, 225, 492, 493
See application file for complete search history.

(56) References Cited

U.S. PATENT DOCUMENTS

| | | | | |
|---|---|---|---|---|
| 3,701,964 A * | 10/1972 | Cronin | .......................... | 439/45 |
| 4,526,432 A * | 7/1985 | Cronin et al. | ................ | 439/320 |
| 4,676,564 A * | 6/1987 | Mitchell, Jr. | ................ | 439/77 |
| 4,737,112 A * | 4/1988 | Jin et al. | ........................ | 439/66 |
| 4,749,356 A * | 6/1988 | Asai et al. | ..................... | 439/67 |
| 4,894,015 A * | 1/1990 | Stockero et al. | ............... | 439/67 |
| 4,950,173 A | 8/1990 | Minemura et al. | | |
| 4,976,626 A * | 12/1990 | Dibble et al. | ................. | 439/67 |
| 5,199,879 A * | 4/1993 | Kohn et al. | .................... | 439/63 |
| 5,241,454 A * | 8/1993 | Ameen et al. | ............... | 361/744 |
| 5,435,732 A * | 7/1995 | Angulas et al. | ............... | 439/67 |
| 5,573,409 A * | 11/1996 | Shiley et al. | ............... | 439/76.1 |
| 5,636,996 A * | 6/1997 | Johnson et al. | ............... | 439/66 |
| 5,812,378 A | 9/1998 | Fjelstad et al. | | |
| 5,865,642 A * | 2/1999 | Rugg | ......................... | 439/499 |
| 5,899,757 A * | 5/1999 | Neidich et al. | ................ | 439/67 |
| 5,951,305 A * | 9/1999 | Haba | ........................... | 439/70 |
| 6,032,359 A * | 3/2000 | Carroll | ........................ | 29/881 |
| 6,504,104 B2 * | 1/2003 | Hacke et al. | ................ | 174/254 |
| 6,881,071 B2 * | 4/2005 | Heilbronner | ................. | 439/67 |
| 2003/0096512 A1 * | 5/2003 | Cornell | ........................ | 439/67 |
| 2006/0148281 A1 * | 7/2006 | Horine et al. | ................ | 439/67 |

FOREIGN PATENT DOCUMENTS

JP    2004-146497    5/2004

* cited by examiner

*Primary Examiner*—Tulsidas C. Patel
*Assistant Examiner*—Vladimir Imas
(74) *Attorney, Agent, or Firm*—Harrity Snyder, LLP

(57) ABSTRACT

A system includes a first electrical device including a conductive structure, and a second electrical device including an opening and a conductor provided in the opening. The conductor contacts the conductive structure of the first electrical device to electrically interconnect the first electrical device to the second electrical device.

16 Claims, 11 Drawing Sheets

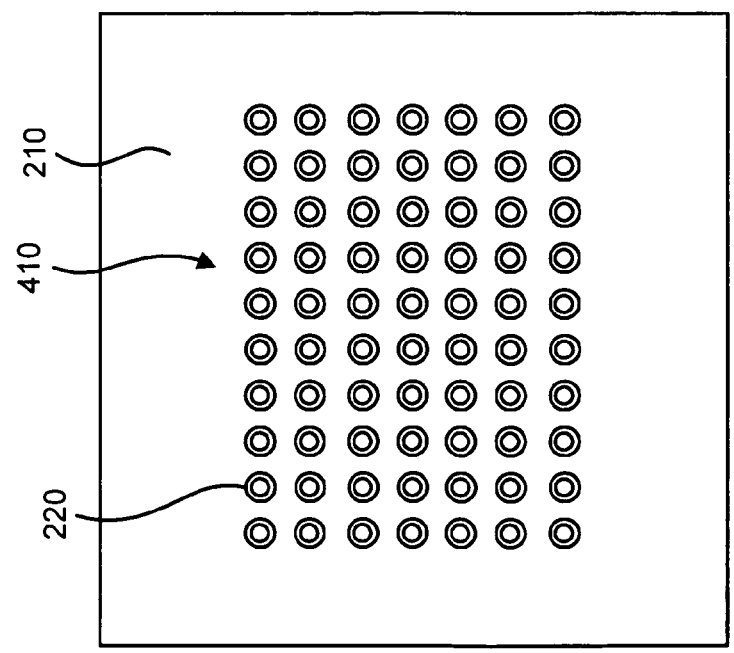
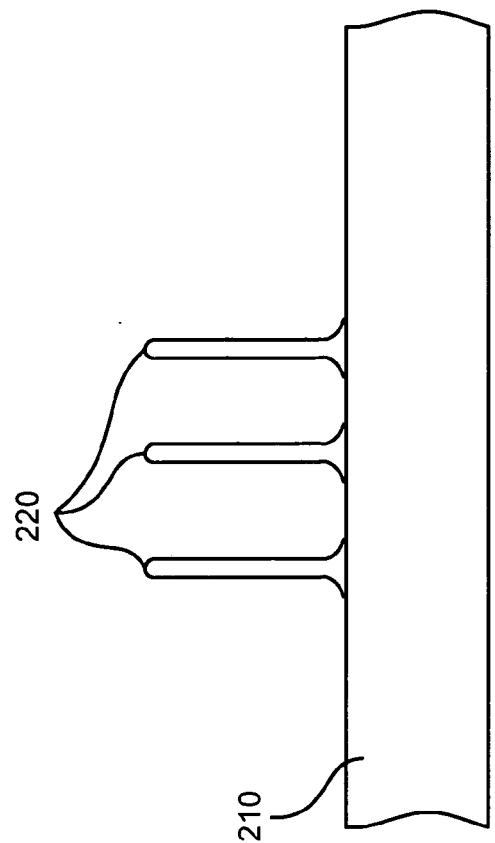
FIG. 4A
FIG. 4B

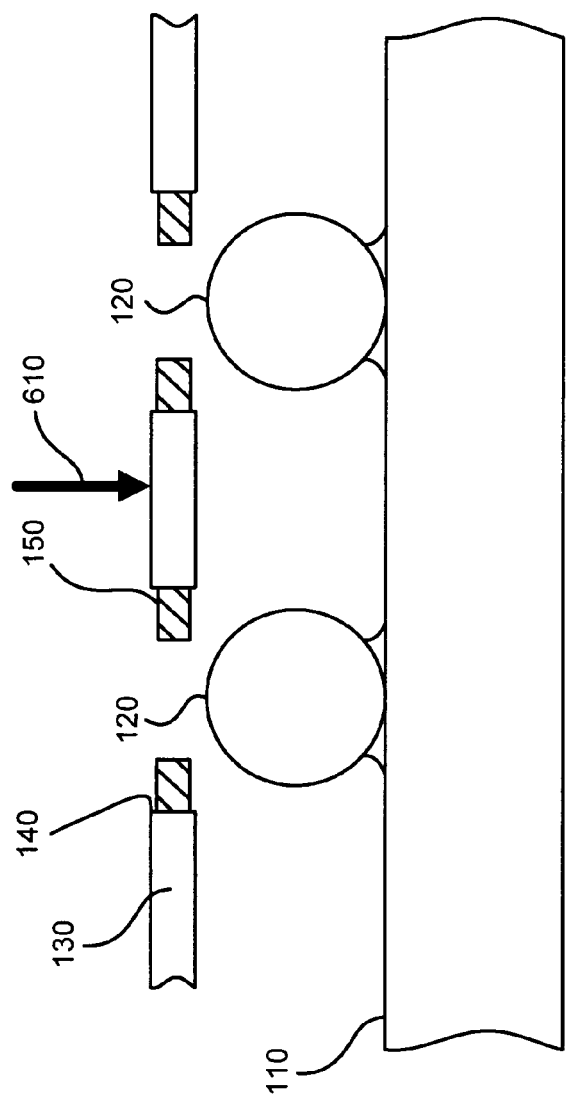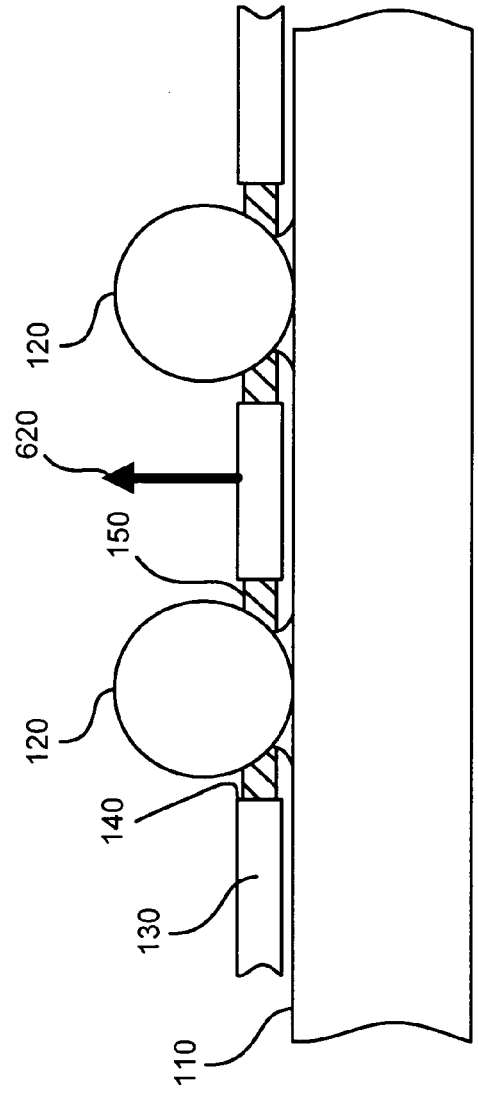

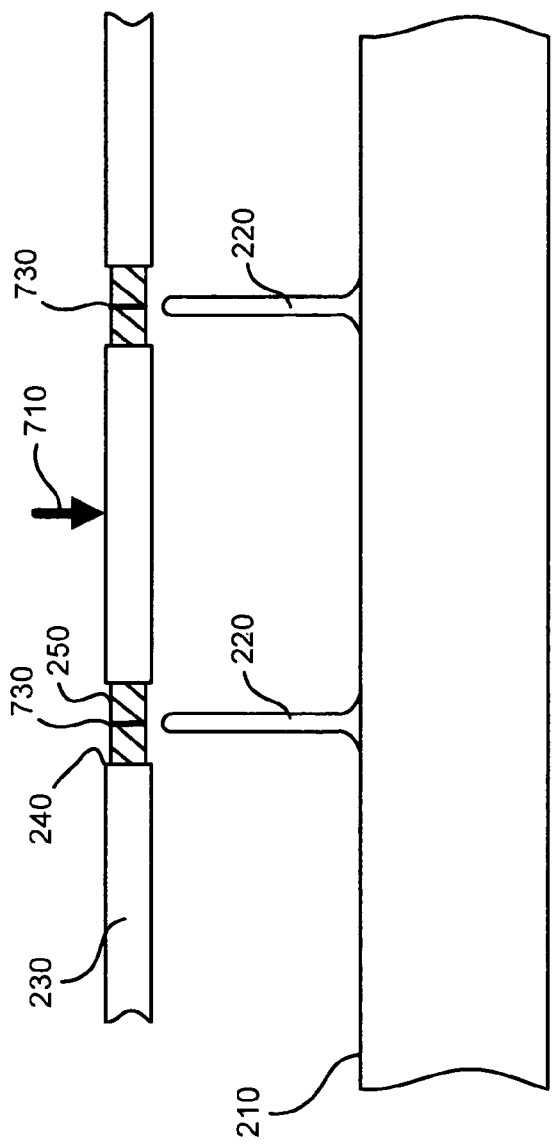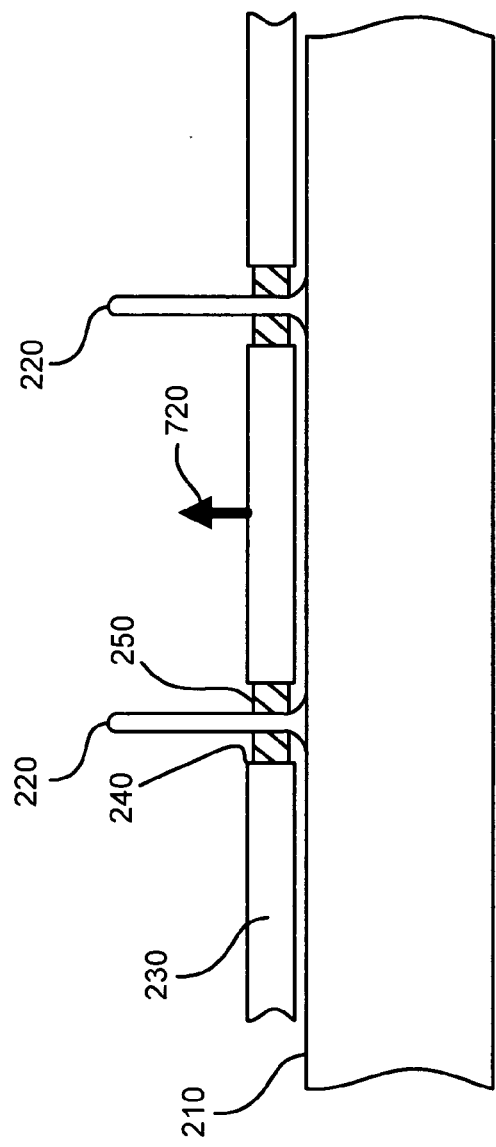

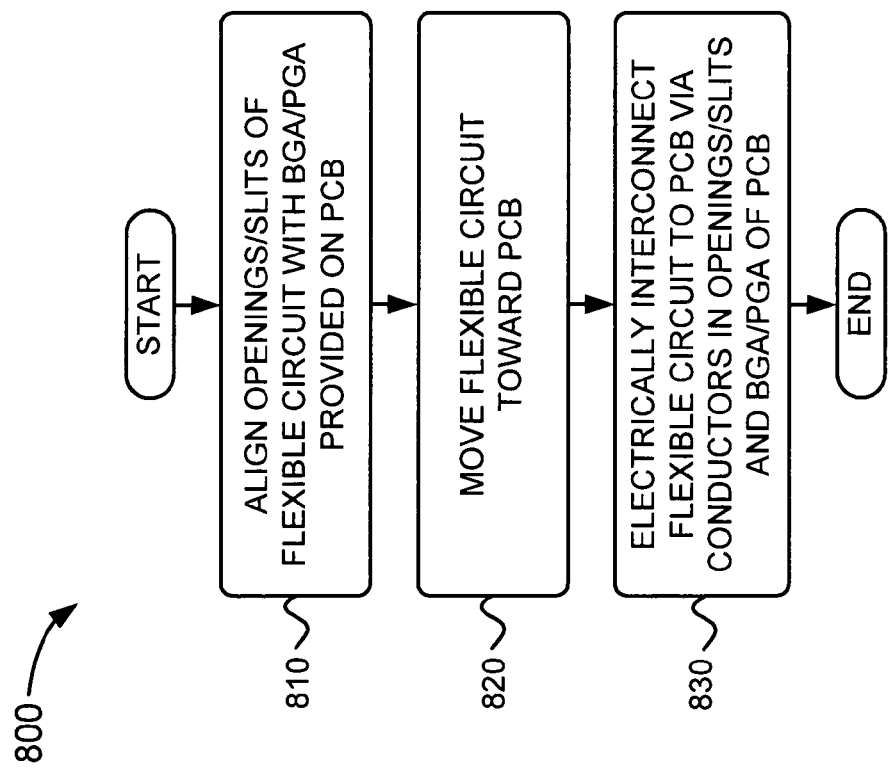

FLEXIBLE CIRCUIT CONNECTORS

BACKGROUND

1. Field of the Invention

Implementations described herein relate generally to devices and, more particularly, to circuit connectors.

2. Description of Related Art

Printed circuit boards (PCBs) (which may be referred to as printing wiring boards (PWBs) or etched wiring board assemblies) may be used in computers, communications devices (e.g., pagers, personal digital assistants (PDAs), telephones, etc.), televisions, cameras, and/or many other devices. In a typical PCB, many electrical components may be attached to the top and/or bottom surfaces of the PCB. PCBs may be used to mechanically support and electrically connect the many electrical components using conductive pathways, or traces, which may be etched from copper sheets laminated onto a non-conductive substrate.

Flexible circuits (which may be referred to as flexible printed circuits (FPCs)) may also be used in the devices described above in connection with PCBs. Flexible circuits may be formed by depositing electrical components on flexible substrates (e.g., thin, flexible plastic or metal foil substrates). In the simplest case, a flexible circuit may be made using the same or similar electrical components used for rigid PCBs, but the substrate may be made flexible instead of rigid. Flexible circuits may be used as connectors in devices where flexibility, space savings, or production constraints limit the serviceability of rigid PCBs. Flexible circuits may be ideal for highly compact products because they may be shaped as desired. Flexible circuits may be effective in preventing incorrect wiring and may reduce wiring costs.

Many devices may incorporate a combination of PCBs and/or flexible circuits. A flexible circuit may interconnect with a PCB(s) in such devices. Electrical interconnects may be used in the majority of all electronic packages, and usually more than once. Electrical interconnects may have the greatest single impact on the ease of assembly and disassembly of an electronic device. For example, the need to produce several million units of a given cellular product (e.g., cellular phone) design per year may necessitate cost-effective and reliable solutions for electrical interconnects.

Currently, PCBs may electrically interconnect to flexible circuits using low insertion force (LIF) or zero insertion force (ZIF) connectors. However, pressure may deform the securing arms of the electrical contacts of a ZIF connector, and/or may displace the electrical contacts. When this happens, the ZIF connector may not provide reliable electrical connection between the flexible circuit and the PCB.

PCBs may also electrically interconnect to flexible circuits using surface mount, pin board to board (BTB) connectors. While BTB connectors may offer certain benefits, they are very unforgiving of tolerance, especially in the (XY) plane of a PCB.

Another type of electrical interconnect may be a ball grid array (BGA). In a BGA, balls of solder may cover (or partially cover) a portion of a PCB in a grid pattern. A flexible circuit may include contacts or pads arranged to match the grid pattern of the BGA. The arrangement may be heated, causing the solder balls to melt. Surface tension may cause the molten solder to hold the PCB in alignment with the flexible circuit, while the solder cools and solidifies. Unfortunately, the solder balls in BGAs may not flex sufficiently, so that bending and thermal expansion of the PCB may be transmitted directly to the flexible circuit. This may cause solder joints to fracture under high thermal or mechanical stress. Another disadvantage of BGAs may be the difficulty in locating soldering faults once soldering is complete.

A further type of electrical interconnect may be a pin grid array (PGA). A PGA may be similar to a BGA, but pins (instead of balls of solder) may cover (or partially cover) a portion of a PCB in a grid pattern. The pins may be used to conduct electrical signals from a circuit (e.g., a flexible circuit) to a PCB to which the circuit may be connected, e.g., via soldering. PGAs may be produced with more and more pins, and with decreasing spacing between the pins, which may cause difficulties for the soldering process. As the pins get closer together, the danger of accidentally bridging adjacent pins with solder may grow.

Another significant disadvantage of LIF, ZIF, and BTB connectors, and BGA and PGA soldering is that such electrical interconnects may be expensive. This may be a distinct disadvantage in today's world of high volume, low cost electrical devices.

SUMMARY

According to one aspect, a device may include a printed circuit board including a ball, and a flexible circuit including an opening and a conductor provided in the opening. The conductor may contact the ball of the rigid electrical device to electrically interconnect the rigid electrical device to the flexible electrical device. The contact between the conductor and the ball may impart a restraining force to prevent the rigid electrical device from disconnecting from the flexible electrical device.

According to another aspect, a device may include a printed circuit board including a pin, and a flexible circuit including a slit and a conductor provided in the slit. The conductor may contact the pin of the rigid electrical device to electrically interconnect the rigid electrical device to the flexible electrical device. The contact between the conductor and the pin may impart a restraining force to prevent the rigid electrical device from disconnecting from the flexible electrical device.

According to yet another aspect, a system may include a first electrical device including a conductive structure, and a second electrical device including an opening and a conductor provided in the opening. The conductor may contact the conductive structure of the first electrical device to electrically interconnect the first electrical device to the second electrical device.

Additionally, the conductor of the second electrical device may surround the conductive structure of the first electrical device.

Additionally, the conductive structure may comprise a ball.

Additionally, the conductor may be circular in shape and may have an inner diameter smaller than a width of the ball.

Additionally, the ball may be spherical in shape and may have a diameter larger than the inner diameter of the conductor.

Additionally, the conductor may be pliable to retain the conductor in contact with the conductive structure and prevent the first electrical device from electrically disconnecting from the second electrical device.

Additionally, the first electrical device may comprise a printed circuit board.

Additionally, the second electrical device may comprise a flexible circuit.

Additionally, the first electrical device may comprise a rigid electrical device and the second electrical device may comprise a flexible electrical device.

Additionally, the first electrical device may comprise a flexible electrical device and the second electrical device may comprise a rigid electrical device.

Additionally, the first electrical device may comprise a first rigid electrical device and the second electrical device may comprise a second rigid electrical device.

Additionally, the first electrical device may comprise a first flexible electrical device and the second electrical device may comprise a second flexible electrical device.

Additionally, the opening of the second electrical device may comprise a slit and the conductive structure of the first electrical device may comprise a pin.

Additionally, the conductor may be rectangular in shape and may have an incision dividing the conductor.

Additionally, the pin may have a width larger than a width of the incision dividing the conductor.

According to a further aspect, a system may include means for providing a rigid support for at least a conductive structure, and means for providing a flexible support for at least a conductor provided in an opening of the flexible support. The conductor may contact the conductive structure of the rigid support to electrically interconnect the rigid support to the flexible support, and may impart a restraining force on the conductive structure to prevent the flexible support from disconnecting from the rigid support.

According to still another aspect, a method may include aligning an opening and a conductor provided in the opening of a first electrical device with a conductive structure of a second electrical device, moving the first electrical device toward the second electrical device, and electrically interconnecting the second electrical device to the first electrical device by contacting the conductor of the first electrical device with the conductive structure of the second electrical device.

Additionally, the conductive structure of the second electrical device may comprise a ball.

Additionally the opening of the first electrical device may comprise a slit and the conductive structure of the second electrical device may comprise a pin.

BRIEF DESCRIPTION OF THE DRAWINGS

The accompanying drawings, which are incorporated in and constitute a part of this specification, illustrate an embodiment of the invention and, together with the description, explain the invention. In the drawings:

FIG. 4A is a top plan view of the exemplary rigid electrical device of FIG. 2;

FIG. 4B is a partial side elevational view of the exemplary rigid electrical device of FIGS. 2 and 4A;

FIG. 6A is a partial side elevational view, in partial cross section, of the exemplary system of FIG. 1 and further showing the force being exerted upon the flexible electrical device, according to an implementation consistent with principles of the invention;

FIG. 6B is a partial side elevational view, in partial cross section, of the exemplary system of FIG. 1 and further showing the force being exerted upon the flexible electrical device upon removal, according to implementations consistent with principles of the invention;

FIG. 7A is a partial side elevational view, in partial cross section, of the exemplary system of FIG. 2 and further showing the force being exerted upon the flexible electrical device, according to an implementation consistent with principles of the invention;

FIG. 7B is a partial side elevational view, in partial cross section, of the exemplary system of FIG. 2 and further showing the force being exerted upon the flexible electrical device upon removal, according to implementations consistent with principles of the invention;

FIG. 8 is a flowchart of an exemplary process according to an implementation consistent with principles of the invention;

DETAILED DESCRIPTION

The following detailed description of the invention refers to the accompanying drawings. The same reference numbers in different drawings may identify the same or similar elements. Also, the following detailed description does not limit the invention.

Implementations consistent with principles of the invention may relate to systems and methods for electrically interconnecting a flexible circuit to a PCB which may be provided in a device. The PCB may include a BGA and/or a PGA, and the flexible circuit may include openings and/or slits for receiving the BGA and/or PGA to electrically interconnect the flexible circuit to the PCB. The systems and methods may provide a quick, easy, and cost-effective way to electrically interconnect the flexible circuit to the PCB. In case of device repair and/or modification, the systems and methods may provide an easy way to disconnect the flexible circuit from the PCB.

The description to follow will describe a device. As used herein, a "device" may include a radiotelephone; a personal communications system (PCS) terminal that may combine a cellular radiotelephone with data processing, a facsimile, and data communications capabilities; a personal digital assistant (PDA) that can include a radiotelephone, pager, Internet/intranet access, web browser, organizer, calendar, a Doppler receiver, and/or global positioning system (GPS) receiver; a laptop; a GPS device; a personal computer; a television; an MP3 player (e.g., an iPod); a printer; a facsimile machine; a pager; and any other device capable of utilizing one or more flexible circuits and/or one ore more PCBs.

Figure 1:
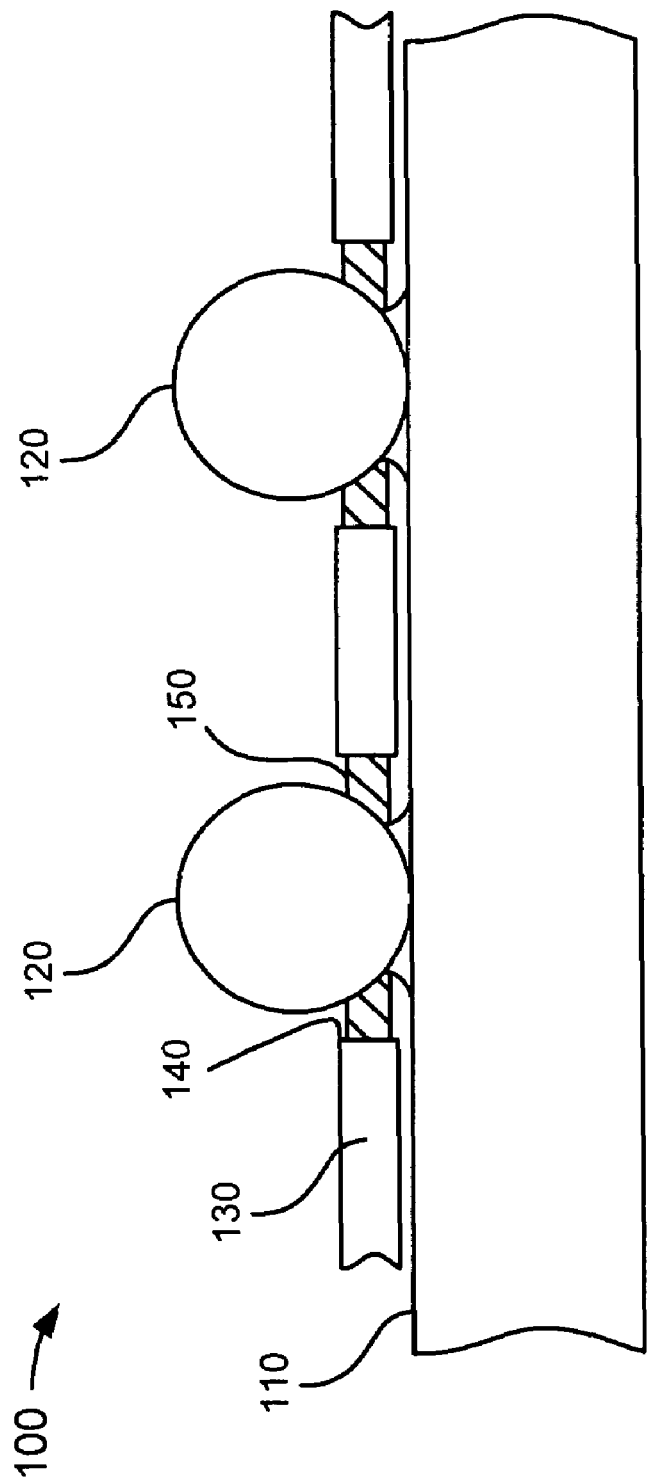
FIG. 1 is a partial side elevational view, in partial cross-section, of an exemplary system for electrically interconnecting a flexible electrical device to a ball grid array of a rigid electrical device, according to an implementation consistent with principles of the invention.

FIG. 1 is an exemplary diagram illustrating concepts consistent with principles of the invention. As shown in FIG. 1, an interconnection system 100 of a device may include a printed circuit board (PCB) 110 that may have a variety of electrical components (e.g., a ball or bump 120 of a ball grid array), and a flexible circuit 130 that may have a variety of electrical components (e.g., a conductor 150 provided in an opening 140). Opening 140 and conductor 150 may be sized smaller than the width (e.g., the diameter) of ball 120 to retain conductor 150 in contact with ball 120 and prevent flexible circuit 130 from being disconnected from PCB 110. The contact between conductor 150 and ball 120 may electrically interconnect flexible circuit 130 to PCB 110.

Figure 2:
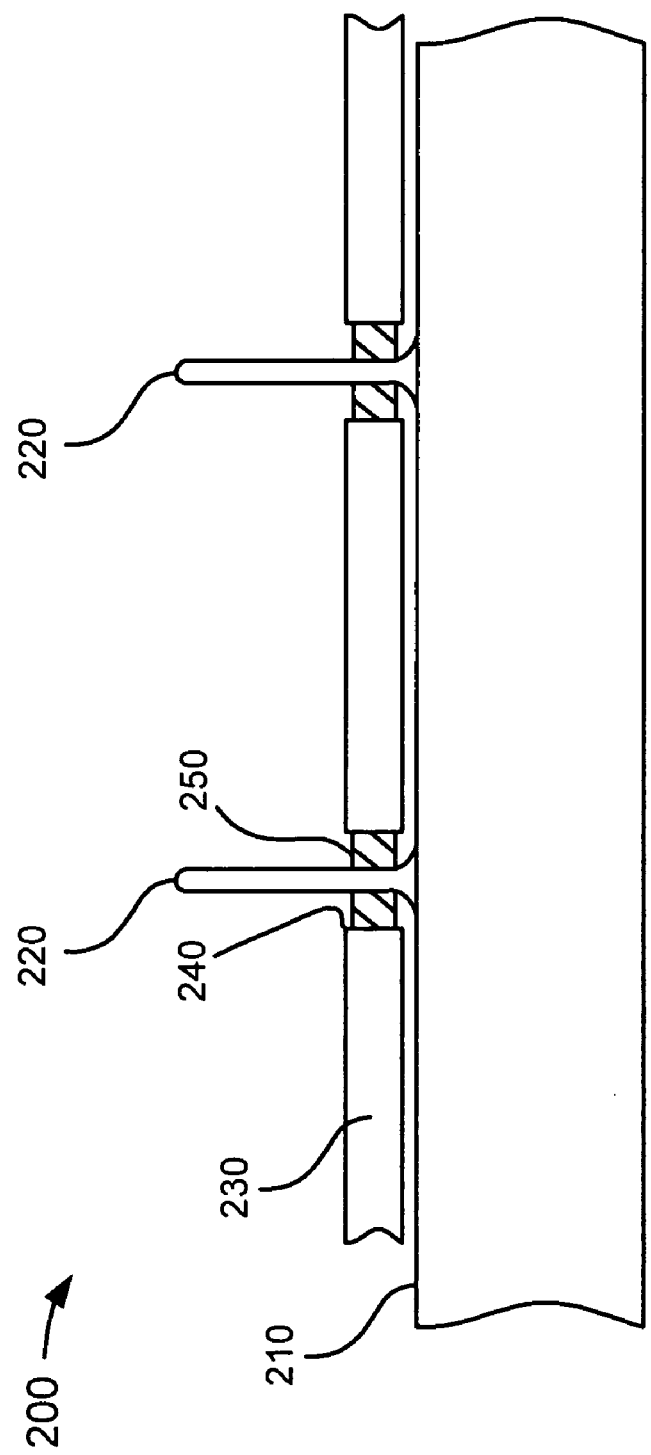
FIG. 2 is a partial side elevational view, in partial cross-section, of an exemplary system for electrically interconnecting a flexible electrical device to a pin grid array of a rigid electrical device, according to an implementation consistent with principles of the invention.

FIG. 2 is an exemplary diagram illustrating concepts consistent with principles of the invention. As shown in FIG. 2, an interconnection system 200 of a device may include a PCB 210 that may have a variety of electrical components (e.g., a pin 220 of a pin grid array), and a flexible circuit 230 that may have a variety of electrical components (e.g., a conductor 250 provided in slit 240). Slit 240 and conductor 250 may be sized smaller than the width (e.g., the diameter) of pin 220 to retain conductor 250 in contact with pin 220 and prevent flexible circuit 230 from being disconnected from PCB 210. The contact between conductor 250 and pin 220 may electrically interconnect flexible circuit 230 to PCB 210.

Exemplary Printed Circuit Boards

Figure 3B:
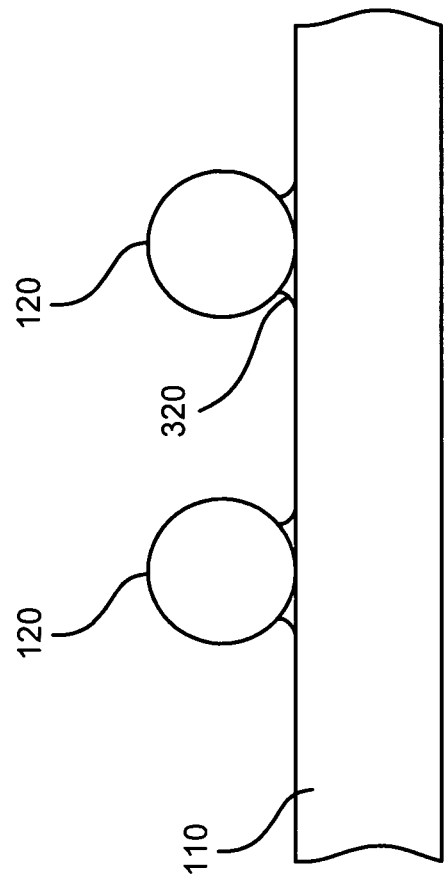
FIG. 3B is a partial side elevational view of the exemplary rigid electrical device of FIGS. 1 and 3A.
Figure 3A:
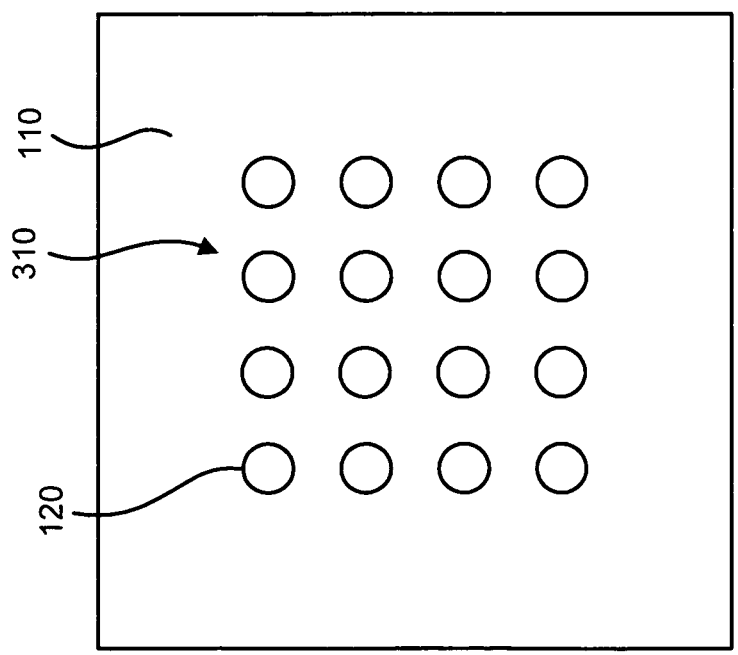
FIG. 3A is a top plan view of the exemplary rigid electrical device of FIG. 1.

FIGS. 3A and 3B are top plan and partial side elevational views, respectively, of the exemplary rigid electrical device (e.g., PCB 110) of FIG. 1. As shown in FIG. 3A, PCB 110 may include one or more balls 120 arranged in a ball grid array (BGA) 310. Although FIG. 3A shows sixteen balls 120 arranged in pattern, in one implementation consistent with principles of the invention, more or fewer balls 120 may be provided on PCB 110 (e.g., a single ball 120 may be provided), and balls 120 may be arranged in a variety patterns (e.g., circular, square, rectangular, etc.) and/or may not be arranged in a pattern (e.g., balls 120 may be randomly located). In another implementation, the pattern of balls 120 may depend upon the desired electrical interconnection. For example, specific electrical components of PCB 110 may be electrically connected to corresponding balls 120 in order to electrically connect these components to, e.g., flexible circuit 130.

Balls 120 may be a variety of sizes and shapes depending upon the size of PCB 110. For example, in one implementation, balls 120 may be spherical, cubical, etc. Balls 120 may be made from a variety of materials, including any of the conductive materials used to make existing BGA balls. For example, in one implementation, balls 120 may include lead-based solder alloys, tin-based solder alloys, etc. The environmental conditions of system 100 may also be a factor in the material choice of balls 120. For example, if system 100 is provided in an environment with excessive heat and/or components of system 100 (e.g., PCB 110) generate excessive heat, then some materials may not be suitable for balls 120 due to possible melting. Balls 120 may be connected to PCB 110 in a variety of ways. For example, in one implementation, balls 120 may be made semi-liquid by heating, and may attach to PCB 110 upon cooling. In another implementation, balls 120 may be connected to PCB 110 using adhesives, glue, solder, and/or similar connection mechanisms 320 (as shown in FIG. 3B).

FIGS. 4A and 4B are top plan and partial side elevational views, respectively, of the exemplary rigid electrical device (e.g., PCB 210) of FIG. 2. As shown in FIG. 4A, PCB 210 may include one or more pins 220 arranged in a pin grid array (PGA) 410. Although FIG. 4A shows seventy pins 220 arranged in pattern, in one implementation consistent with principles of the invention, more or fewer pins 220 may be provided on PCB 210 (e.g., a single pin 220 may be provided), and pins 220 may be arranged in a variety patterns (e.g., circular, square, rectangular, etc.) and/or may not be arranged in a pattern (e.g., pins 220 may be randomly located). In another implementation, the pattern of pins 220 may depend upon the desired electrical interconnection. For example, specific electrical components of PCB 210 may be electrically connected to corresponding pins 220 in order to electrically connect these components to, e.g., flexible circuit 230.

Pins 220 may be a variety of sizes and shapes depending upon the size of PCB 110. For example, in one implementation, pins 220 may have a circular, square, etc. cross section. Pins 220 may be made from a variety of materials, including any of the conductive materials used to make existing PGA pins. For example, in one implementation, pins 220 may include copper-based alloys, iron-based alloys, chromium-based alloys, etc. The environmental conditions of system 200 may also be a factor in the material choice of pin 220. For example, if system 200 is provided in an environment with excessive heat and/or components of system 200 (e.g., PCB 210) generate excessive heat, then some materials may not be suitable for pins 220 due to possible melting. Pins 220 may be connected to PCB 210 in a variety of ways. For example, in one implementation, pins 220 may be connected to PCB 210 using adhesives, glue, solder, and/or similar connection mechanisms.

PCBs 110 and 210 may be a variety of sizes and shapes depending upon their use in a device, and/or the size of the device. For example, in one implementation, PCBs 110 and 210 may be smaller in size if they are provided in a cellular phone, than if they are provided in a big screen television. PCBs 110 and 210 may be made from a variety of materials, including any of the materials used to make existing PCBs. For example, in one implementation, PCBs 110 and 210 may include conductive pathways, or traces, which may be etched from copper sheets laminated onto a non-conductive substrate. PCBs 110 and 210 may include a variety of electrical components depending upon their use in a device. For example, PCBs 110 and 210 may include contacts, traces, capacitors, resistors, inductors, varistors, diodes, transistors, oscillators, resonators, relays, etc.

Although FIGS. 1-4B show what is termed a "printed circuit board," in one implementation consistent with principles of the invention, PCBs 110 and 210 may be replaced with any rigid electronics based substrate (i.e., a rigid electrical device), e.g., rigid-flex circuits, semiconductor packages, multichip modules, micro electro mechanical systems (MEMS), ceramic circuits, etc.

Figure 9:
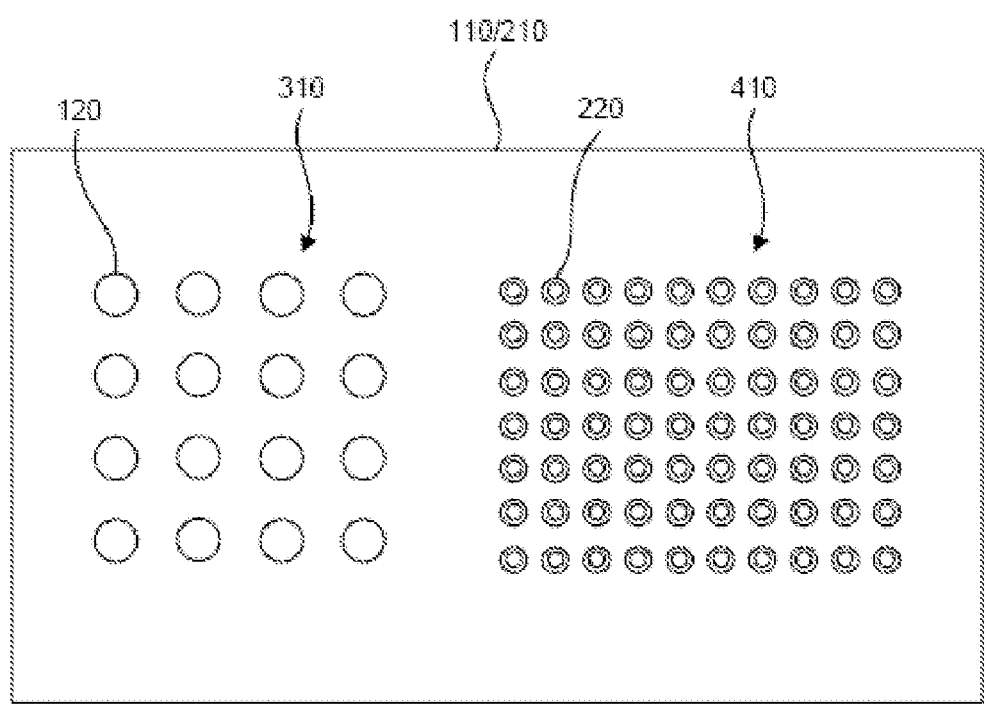
FIG. 9 is a top plan view of a rigid electrical device that may include one or more balls arranged in a ball grid array (BGA), and one or more pins arranged in a pin grid array (PGA)

In an implementation consistent with principles of the invention, PCB 110 may include any combination of balls 120 and pins 220. In another implementation, PCB 210 may include any combination of pins 220 and balls 120. For example, FIG. 9 is a top plan view of a rigid electrical device 110/210 that may include one or more balls 120 arranged in ball grid array (BGA) 310, and one or more pins 220 arranged in a pin grid array (PGA) 410.

Exemplary Flexible Circuits

Figure 5B:
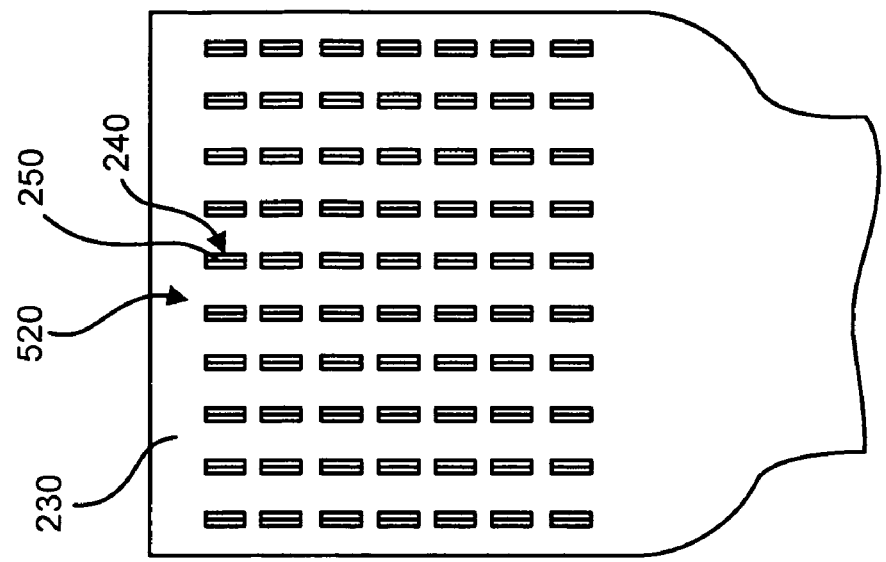
FIG. 5B is a partial top plan view of the exemplary flexible electrical device of FIG. 2.
Figure 5A:
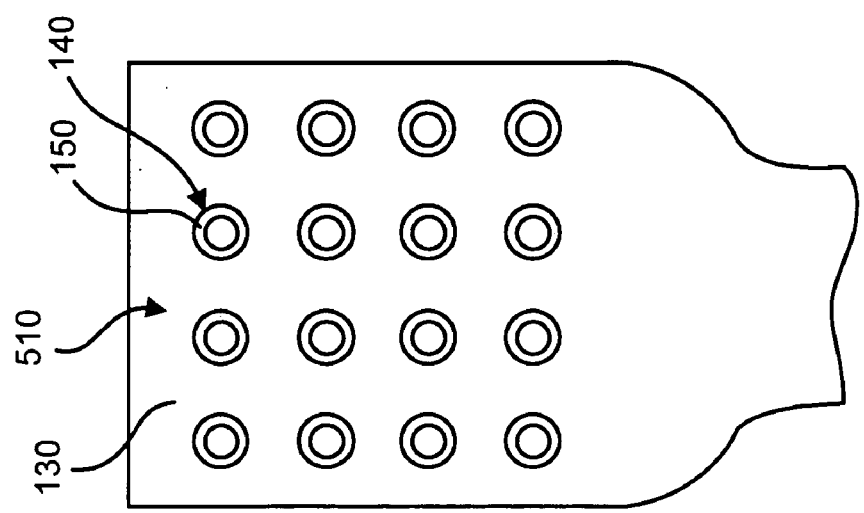
FIG. 5A is a partial top plan view of the exemplary flexible electrical device of FIG. 1.

FIG. 5A is a top plan view of the exemplary flexible electrical device (e.g., flexible circuit 130) of FIG. 1. As shown in FIG. 5A, flexible circuit 130 may include one or more openings 140 arranged in an array 510. Openings 140 may be provided in flexible circuit 130 using existing techniques, e.g., stamping, pressing, cutting, etc. Each opening 140 may include conductor 150 that may electrically connect to an electrical component of flexible circuit 130. Openings 140 and conductors 150 may be arranged in a pattern to match the pattern of a BGA (e.g., BGA 310 shown in FIG. 3A) of PCB 110. Although FIG. 5A shows sixteen openings 140 and conductors 150 arranged in a pattern, in one implementation consistent with principles of the invention, more or fewer openings 140 and conductors 150 may be provided on flexible circuit 130 (e.g., a single opening 140 and conductor 150 may be provided). Openings 140 and conductors 150 may be arranged in a variety patterns (e.g., circular, square, rectangular, etc.) and/or may not be arranged in a pattern (e.g., openings 140 and conductors 150 may be randomly located). In another implementation, the pattern of openings 140 and conductors 150 may depend upon the desired electrical interconnection. For example, specific electrical components of flexible circuit 130 may be electrically connected to corresponding conductors 150 in order to electrically connect these components to, e.g., PCB 110.

Conductors 150 may be a variety of sizes and shapes depending upon the sizes and shapes of balls 120. For example, in one implementation, each conductor 150 may be shaped (e.g., circular) to receive a corresponding ball 120, but may have an inner diameter that may be smaller than a diameter of ball 120 to maintain contact with ball 120 and electrically interconnect conductor 150 to ball 120. Conductors 150 may be made from a variety of materials, including any of the materials used to make existing conductors in flexible circuits. For example, in one implementation, conductors 150 may include any conductive (e.g., metal-based) material that may be pliable enough to receive balls 120 and still maintain contact with balls 120. The environmental conditions of system 100 may also be a factor in the material choice of conductors 150. For example, if system 100 is provided in an environment with excessive heat and/or components of system 100 (e.g., PCB 110) generate excessive heat, then some materials may not be suitable for conductors 150 due to possible melting. Conductors 150 may connect to components of flexible circuit 130 in a variety of ways. For example, in one implementation, conductors 150 may connect to components of flexible circuit 130 via conductive pathways, or traces, which may be provided in flexible circuit 130.

FIG. 5B is a top plan view of the exemplary flexible electrical device (e.g., flexible circuit 230) of FIG. 2. As shown in FIG. 5B, flexible circuit 230 may include one or more slits 240 arranged in an array 520. Slits 240 may be provided in flexible circuit 230 using existing techniques, e.g., stamping, pressing, cutting, etc. Each slit 240 may include conductor 250 that may electrically connect to an electrical component of flexible circuit 230. Slits 240 and conductors 250 may be arranged in a pattern to match the pattern of a PGA (e.g., PGA 410 shown in FIG. 4A) of PCB 210. Although FIG. 5B shows seventy slits 240 and conductors 250 arranged in a pattern, in one implementation consistent with principles of the invention, more or fewer slits 240 and conductors 250 may be provided on flexible circuit 230 (e.g., a single slit 240 and conductor 250 may be provided). Slits 240 and conductors 250 may be arranged in a variety patterns (e.g., circular, square, rectangular, etc.) and/or may not be arranged in a pattern (e.g., slits 240 and conductors 250 may be randomly located). In another implementation, the pattern of slits 240 and conductors 250 may depend upon the desired electrical interconnection. For example, specific electrical components of flexible circuit 230 may be electrically connected to corresponding conductors 250 in order to electrically connect these components to, e.g., PCB 210.

Conductors 250 may be a variety of sizes and shapes depending upon the sizes and shapes of pins 220. For example, in one implementation, each conductor 250 may be shaped (e.g., two rectangles divided in two by an incision 730, as shown in FIG. 7A) to receive a corresponding pin 220, but may completely enclose a corresponding slit 240 to maintain contact with pin 220 and electrically interconnect conductor 250 to pin 220. Conductors 250 may be made from a variety of materials, including any of the materials used to make existing conductors in flexible circuits. For example, in one implementation, conductors 250 may include any conductive (e.g., metal-based) material that may be pliable enough to receive pins 220 and still maintain contact with pins 220. The environmental conditions of system 200 may also be a factor in the material choice of conductors 250. For example, if system 200 is provided in an environment with excessive heat and/or components of system 200 (e.g., PCB 210) generate excessive heat, then some materials may not be suitable for conductors 250 due to possible melting. Conductors 250 may connect to components of flexible circuit 230 in a variety of ways. For example, in one implementation, conductors 250 may connect to components of flexible circuit 230 via conductive pathways, or traces, which may be provided in flexible circuit 230.

Flexible circuits 130 and 230 may be a variety of sizes and shapes depending upon their use in a device, and/or the size of the device. For example, in one implementation, flexible circuits 130 and 230 may be smaller in size if they are provided in a cellular phone, than if they are provided in a big screen television. Flexible circuits 130 and 230 may be made from a variety of materials, including any of the materials used to make existing flexible circuits. For example, in one implementation, flexible circuits 130 and 230 may be formed by depositing electrical components on flexible substrates (e.g., thin, flexible plastic or metal foil substrates). Flexible circuits 130 and 230 may include a variety of electrical components depending upon their use in the device. For example, flexible circuits 130 and 230 may include the same or similar electrical components used for PCBs, as described above (e.g., contacts, traces, capacitors, resistors, inductors, varistors, diodes, transistors, oscillators, resonators, relays, etc.). Flexible circuits 130 and 230 may be single-sided flexible circuits, double-sided flexible circuits, multilayer flexible circuits, rigid flexible circuits, and/or other similar circuits.

Although FIGS. 1, 2, 5A, and 5B shows what is termed a "flexible circuit," in one implementation consistent with principles of the invention, flexible circuits 130 and 230 may be replaced with any flexible substrate capable of containing electrical components (i.e., a flexible electrical device), and/or any type of flexible electronics, e.g., a ribbon cable.

Figure 10:
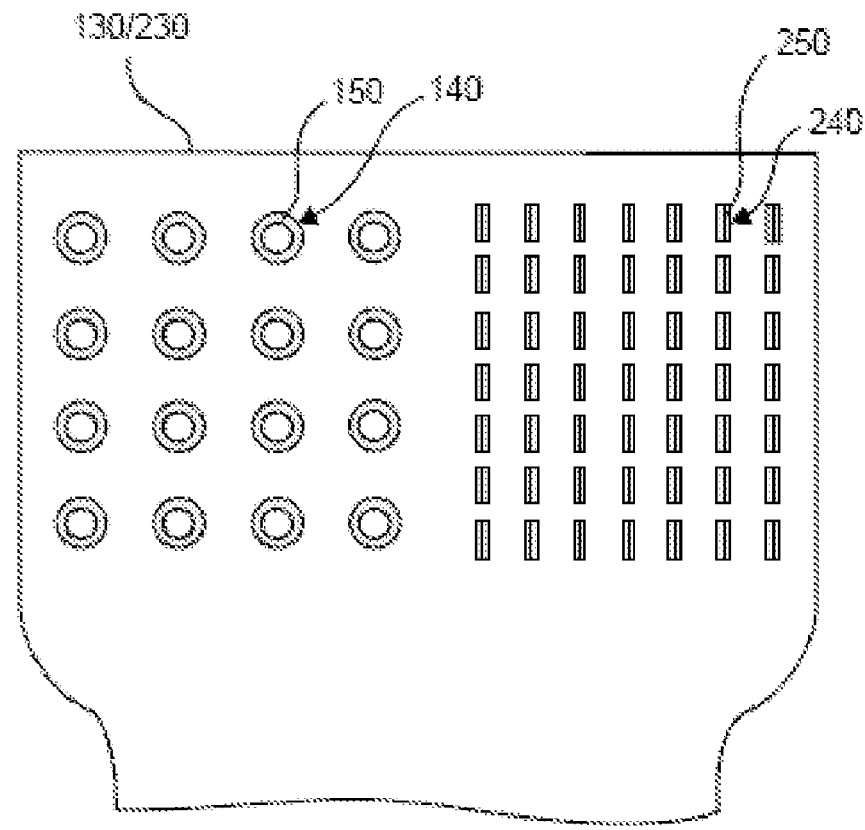
FIG. 10 is a top plan view of a flexible electrical device that may include one or more openings and conductors arranged in a pattern, and one or more slits and conductors arranged in a pattern.
Figure 11:
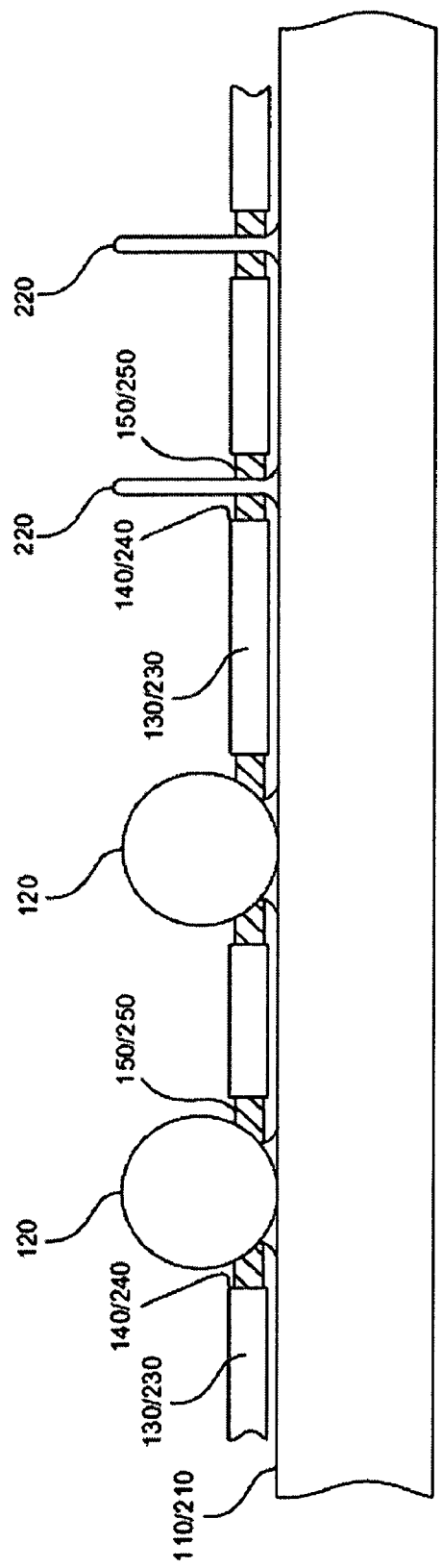
FIG. 11 is a partial side elevational view, in partial cross-section, showing a rigid electrical device that includes a plurality of balls and and pins, and a flexible electrical device that includes a plurality of openings and conductors provided in the plurality of openings, where the conductors contact the plurality of balls and pins of the rigid electrical device.

In an implementation consistent with principles of the invention, flexible circuit 130 may include a combination of openings 140 and slits 240. In another implementation, flexible circuit 230 may include a combination of slits 240 and openings 140. The combination of openings 140 and slits 240 in flexible circuits 130 and 230 may depend upon the combination of balls 120 and pins 220, as described above, on PCBs 110 and 210. For example, FIG. 10 is a top plan view of a flexible electrical device 130/230 that may include one or more openings 140 and conductors 150 arranged in a pattern, and one or more slits 240 and conductors 250 arranged in a pattern. In another example, FIG. 11 shows rigid electrical devide 110/120 that includes a plurality of balls 120 and pins 220, and flexible electrical device 130/230 tha includes a plurality of openings 140/240 and conductors 150/250 provided in the plurality of openings 140/240, where conductors 150/250 contact the plurality of balls 120 and pins 220 of rigid electrical device 110/210.

Exemplary Processes

FIGS. 6A and 6B are partial side elevational views of the exemplary system 100 of FIG. 1, and further show how to assemble and disassemble system 100. As shown in FIG. 6A, openings 140 and conductors 150 of flexible circuit 130 may be aligned with balls 120 of PCB 110. A downward force 610 may be exerted upon flexible circuit 130 to move flexible circuit 130 toward PCB 110. Conductors 150 may flex around balls 120 so that flexible circuit 130 may be connected to PCB 110. Since conductors 150 may be pliable and sized smaller than balls 120, conductors 150 may firmly hold conductors 150 and balls 120 in contact, as shown in FIG. 6B. When conductors 150 and balls 120 engage each other, they may electrically interconnect flexible circuit 130 to PCB 110. Conductors 150 and balls 120 may remain together due to a restraining force imparted by conductors 150 on balls 120.

As further shown in FIG. 6B, an upward force 620 may be exerted upon flexible circuit 130 to move flexible circuit 130 away from PCB 110, which may permit flexible circuit 130 to be electrically uncoupled from PCB 110. The pliable conductors 150 may flex around balls 120 so that flexible circuit 130 may be disconnected from PCB 110.

FIGS. 7A and 7B are partial side elevational views of the exemplary system 200 of FIG. 2, and further show how to assemble and disassemble system 200. As shown in FIG. 7A, slits 240 and conductors 250 of flexible circuit 230 may be aligned with pins 220 of PCB 210. A downward force 710 may be exerted upon flexible circuit 230 to move flexible circuit 230 toward PCB 210. Conductors 250 may flex around pins 220 (e.g., via incisions 730 provided in conductors 250) so that flexible circuit 230 may be connected to PCB 210. Since conductors 250 may be pliable and may contain incisions 730 through which pins 220 may extend, conductors 250 may firmly hold conductors 250 and pins 220 in contact, as shown in FIG. 7B. When conductors 250 and pins 220 engage each other, they may electrically interconnect flexible circuit 230 to PCB 210. Conductors 250 and pins 220 may remain together due to a restraining force imparted by conductors 250 on pins 220.

As further shown in FIG. 7B, an upward force 720 may be exerted upon flexible circuit 230 to move flexible circuit 230 away from PCB 210, which may permit flexible circuit 230 to be electrically uncoupled from PCB 210. The pliable conductors 250 may flex around pins 220 so that flexible circuit 230 may be disconnected from PCB 210.

FIG. 8 is a flowchart of an exemplary process 800 according to implementations consistent with principles of the invention. As shown in FIG. 8, process 800 may include aligning openings and/or slits of a flexible circuit with a BGA and/or a PGA provided on a PCB (block 810). For example, in one implementation described above in connection with FIG. 6A, openings 140 and conductors 150 of flexible circuit 130 may be aligned with balls 120 of PCB 110. In another implementation described above in connection with FIG. 7A, slits 240 and conductors 250 of flexible circuit 230 may be aligned with pins 220 of PCB 210.

As further shown in FIG. 8, process 800 may include moving the flexible circuit towards the PCB (block 820). For example, in one implementation described above in connection with FIG. 6A, downward force 610 may be exerted upon flexible circuit 130 to move flexible circuit 130 toward PCB 110. In another implementation described above in connection with FIG. 7A, downward force 710 may be exerted upon flexible circuit 230 to move flexible circuit 230 toward PCB 210.

Process 800 may include electrically interconnecting the flexible circuit to the PCB via conductors provided in the openings and/or slits of the flexible circuit and the BGA and/or PGA of the PCB (block 830). For example, in one implementation described above in connection with FIGS. 6A and 6B, conductors 150 may flex around balls 120 so that flexible circuit 130 may be connected to PCB 110. Conductors 150 may firmly hold conductors 150 and balls 120 in contact, as shown in FIG. 6B. When conductors 150 and balls 120 engage each other, they may electrically interconnect flexible circuit 130 to PCB 110. In another implementation described above in connection with FIGS. 7A and 7B, conductors 250 may flex around pins 220 (via incisions 730 provided in conductors 250) so that flexible circuit 230 may be connected to PCB 210. Conductors 250 may firmly hold conductors 250 and pins 220 in contact, as shown in FIG. 7B. When conductors 250 and pins 220 engage each other, they may electrically interconnect flexible circuit 230 to PCB 210.

CONCLUSION

Implementations consistent with principles of the invention may relate to systems and methods for electrically interconnecting a flexible electrical device (e.g., flexible circuit 130) to a rigid electrical device (e.g., PCB 100) which may be provided in a variety of devices. The rigid electrical device may include a BGA and/or a PGA, and the flexible electrical device may include openings and/or slits for receiving the BGA and/or PGA to electrically interconnect the flexible electrical device to the rigid electrical device. The systems and methods may provide a quick, easy, and cost-effective way to electrically interconnect the flexible electrical device to the rigid electrical device. In case of device repair and/or modification, the systems and methods may provide an easy way to disconnect the flexible electrical device from the rigid electrical device. The systems and methods may provide an electrical interconnection system that may have a low profile, which may be beneficial as devices continue to decrease in size.

The foregoing description of preferred embodiments of the invention provides illustration and description, but is not intended to be exhaustive or to limit the invention to the precise form disclosed. Modifications and variations are possible in light of the above teachings or may be acquired from practice of the invention. For example, while series of acts have been described with regard to FIGS. 6A-8, the order of the acts may be modified in other implementations consistent with principles of the invention. Further, non-dependent acts may be performed in parallel. Furthermore, although the Figures show the interconnection of a flexible electrical device (e.g., flexible circuit 130) and a rigid electrical device (e.g., PCB 110), the interconnection mechanism (e.g., BGA and/or PGA interconnection) may be used to electrically interconnect a flexible electrical device to another flexible electrical device and/or to electrically interconnect a rigid electrical device to another rigid electrical device, according to implementations consistent with principles of the invention.

It should be emphasized that the term "comprises/comprising" when used in the this specification is taken to specify the presence of stated features, integers, steps or components but does not preclude the presence or addition of one or more other features, integers, steps, components or groups thereof.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A device comprising:
    a rigid circuit including a plurality of balls and pins; and
    a flexible circuit including a plurality of openings and conductors provided in the plurality of openings, the conductors contacting the plurality of balls and pins of the rigid circuit to electrically interconnect the rigid circuit to the flexible circuit, and the contact between the conductors and the plurality of balls and pins imparting a restraining force to prevent the rigid circuit from disconnecting from the flexible circuit.

2. A system comprising:
    a rigid electrical device including a plurality of balls and pins; and
    a flexible electrical device including a plurality of openings and conductors provided in the plurality of openings, the conductors contacting the plurality of balls and pins of the rigid electrical device to electrically interconnect the rigid electrical device to the flexible electrical device, and contact between the conductors and the plurality of balls and pins imparting a restraining force to prevent the rigid electrical device from disconnecting from the flexible electrical device.

3. The system of claim 2, wherein the conductors of the flexible electrical device surround the plurality of balls and pins of the rigid electrical device.

4. The system of claim 2, wherein each of the plurality of balls includes a width.

5. The system of claim 4, wherein some of the conductors are circular in shape and have inner diameters smaller than the widths of the plurality of balls.

6. The system of claim 5, wherein the plurality of balls are spherical in shape and have diameters larger than the inner diameters of some of the conductors.

7. The system of claim 2, wherein the conductors are pliable to retain the conductors in contact with the plurality of balls and pins and prevent the rigid electrical device from electrically disconnecting from the flexible electrical device.

8. The system of claim 2, wherein the rigid electrical device comprises a rigid printed circuit board and the flexible electrical device comprises a flexible circuit.

9. The system of claim 2, wherein some of the plurality of openings of the flexible electrical device comprise slits for receiving the plurality of pins of the rigid electrical device.

10. The system of claim 9, wherein the conductors provided in the slits are rectangular in shape and have incisions dividing the conductors provided in the slits.

11. The system of claim 10, wherein the plurality of pins have widths larger than the widths of the incisions dividing the conductors provided in the slits.

12. A system comprising:
    means for providing a rigid support for at least a plurality of balls and pins; and
    means for providing a flexible support for at least a plurality of conductors provided in a plurality of openings of the flexible support, the plurality of conductors contacting the plurality of balls and pins of the rigid support to electrically interconnect the rigid support to the flexible support.

13. A method comprising:
    aligning a plurality of openings and conductors provided in a plurality of openings of a rigid electrical device with a plurality of balls and pins of a flexible electrical device;
    moving the rigid electrical device toward the flexible electrical device;
    electrically interconnecting the flexible electrical device to the rigid electrical device by contacting the conductors of the rigid electrical device with the plurality of balls and pins of the flexible electrical device; and
    imparting a restraining force, via contact between the conductors and the plurality of balls and pins, to prevent the rigid electrical device from disconnecting from the flexible electrical device.

14. The method of claim 13, wherein some of the plurality of openings receive the plurality of balls, and the remaining plurality of openings receive the plurality of pins.

15. The method of claim 13, wherein some of the plurality of openings of the rigid electrical device comprise slits for receiving the plurality of pins of the flexible electrical device.

16. The system of claim 2, wherein the plurality of balls and pins of the rigid electrical device are arranged in one of a circular, square, or rectangular pattern, and the plurality of openings of the flexible electrical device are arranged in a pattern corresponding to the pattern of the plurality of balls and pins, each of the plurality of openings receiving a corresponding one of the plurality of balls and pins.

* * * * *